United States Patent [19]
Kim

[11] Patent Number: 4,835,458
[45] Date of Patent: May 30, 1989

[54] SIGNATURE ANALYSIS TECHNIQUE FOR DEFECT CHARACTERIZATION OF CMOS STATIC RAM CELL FAILURES

[75] Inventor: Sang U. Kim, Tempe, Ariz.

[73] Assignee: Intel Corporation, Santa Clara, Calif.

[21] Appl. No.: 118,256

[22] Filed: Nov. 9, 1987

[51] Int. Cl.$^4$ .................. G01R 15/12; G11C 11/40; G06F 11/26

[52] U.S. Cl. .................. 324/73 R; 324/158 R; 324/73 AT; 371/21; 365/201

[58] Field of Search .......... 324/73 R, 73 AT, 158 R, 324/158 T; 371/20, 25, 26; 365/201, 154; 437/8

[56] References Cited

U.S. PATENT DOCUMENTS

| | | | |
|---|---|---|---|
| 4,004,222 | 1/1971 | Gebhard | 371/21 X |
| 4,369,511 | 1/1983 | Kimura et al. | 371/25 X |
| 4,414,665 | 11/1983 | Kimura et al. | 365/201 X |
| 4,542,340 | 9/1985 | Chakravarti et al. | 324/158 T |
| 4,613,886 | 9/1986 | Chwang | 365/154 X |
| 4,679,171 | 7/1987 | Logwood et al. | 365/154 X |
| 4,685,086 | 8/1987 | Tran | 365/201 X |
| 4,710,897 | 12/1987 | Masuoka et al. | 365/154 X |

*Primary Examiner*—Reinhard J. Eisenzopf
*Assistant Examiner*—Vinh P. Nguyen
*Attorney, Agent, or Firm*—Blakely, Sokoloff, Taylor & Zafman

[57] ABSTRACT

An error testing process for the testing of CMOS static RAM memories. Individual static RAM memory cells that have failed are isolated. A typical cell has six transistors, two access, two n-channel and two p-channel. The access transistors are allowed to float which effectively isolates the cell. By application of voltages to the n-channel or p-channel transistors one set can be turned off and the remaining two n-channel or p-channel transistors can be tested with microprobes varying voltages for the forward and reverse bias testing. The graphs of the current flow from these tests are compared using the signature analysis technique so that not only the exact transistor which failed can be identified but the failure mechanism can also be identified. This process permits error testing without damage to the RAM memory and without physical isolation of the SRAM memory.

14 Claims, 5 Drawing Sheets

EQUIVALENT CIRCUIT WITH BIAS CONDITIONS

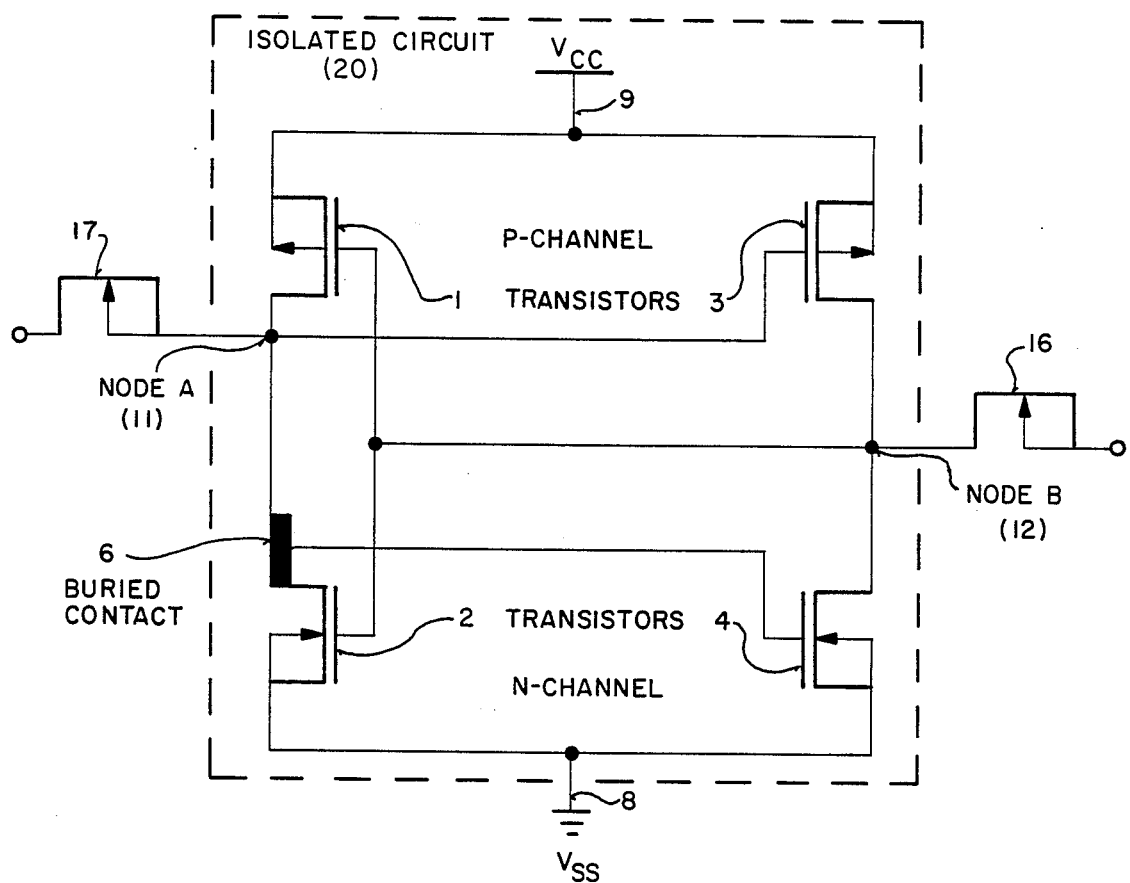
FIG_1
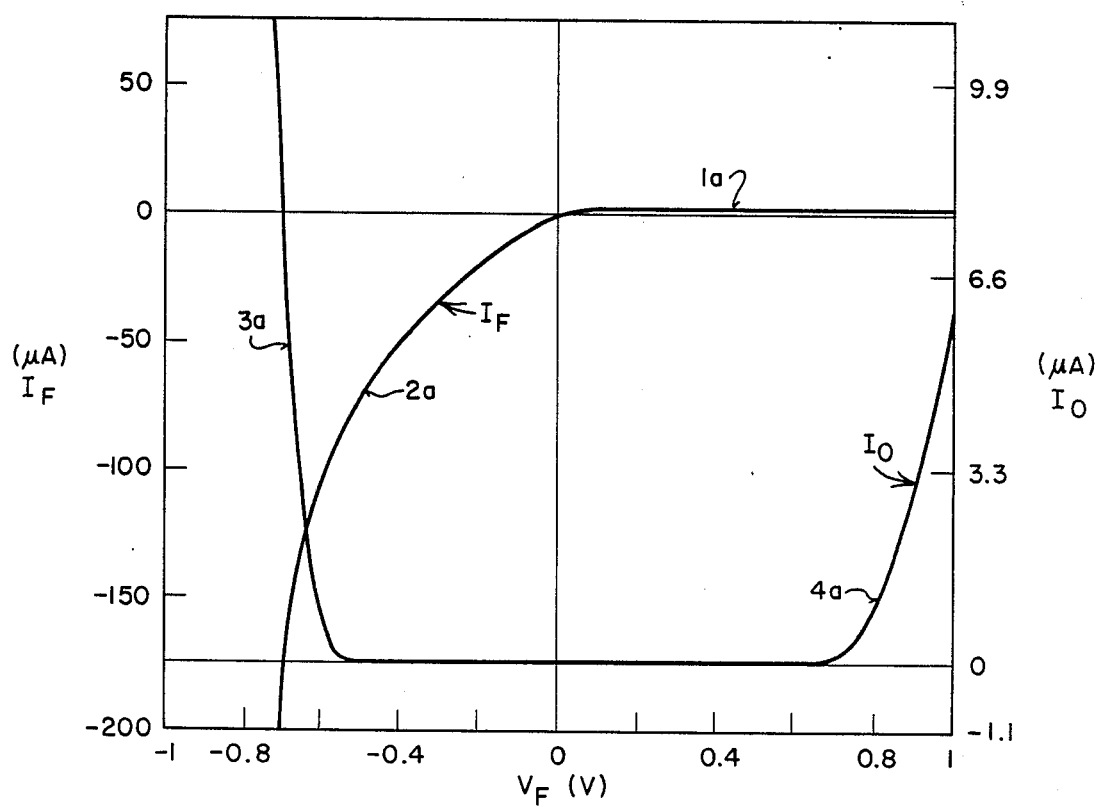
FIG_2 TYPICAL ELECTRICAL SIGNATURES FROM A GOOD CELL

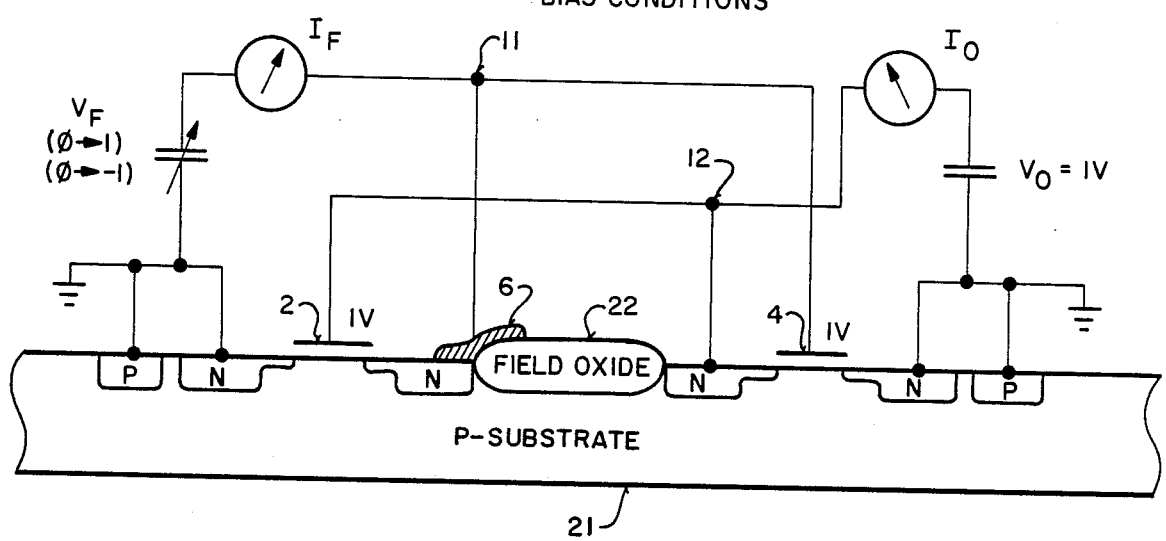
FIG_3A  EQUIVALENT CIRCUIT WITH BIAS CONDITIONS
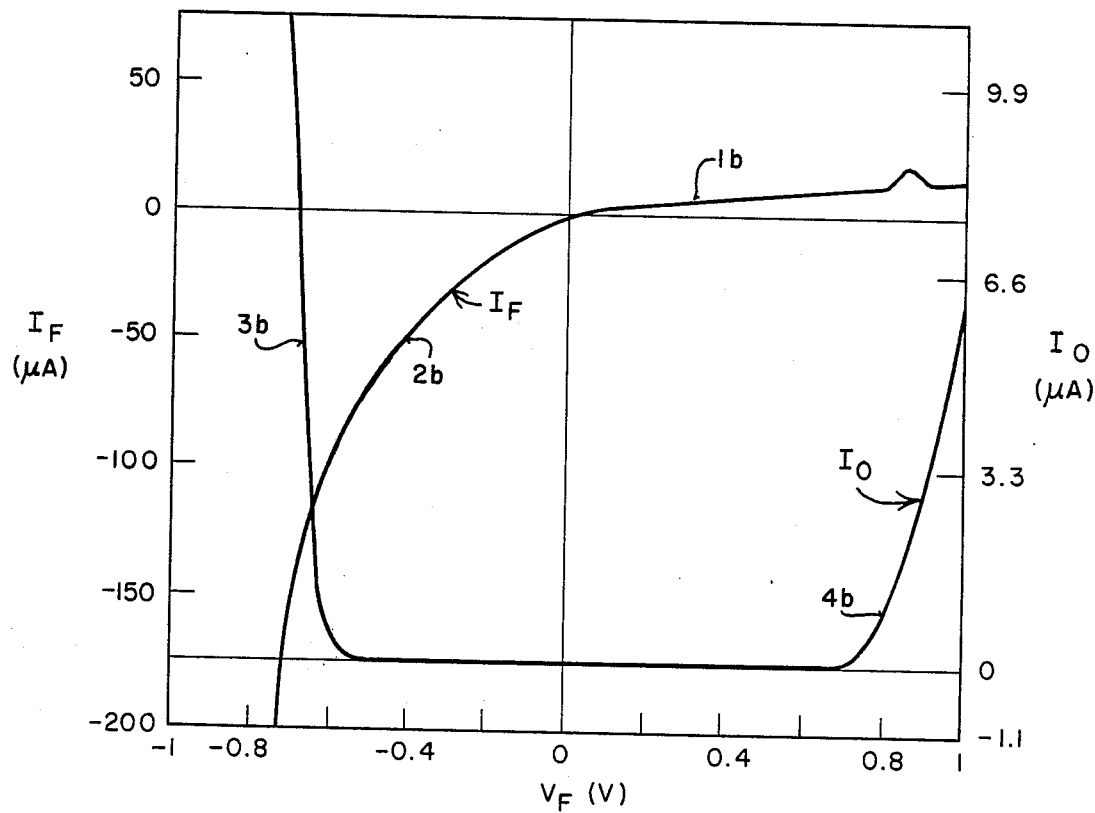
FIG_3B  ELECTRICAL SIGNATURE WITH $V_F$ AT NODE A (11) FOR FAILED CELL

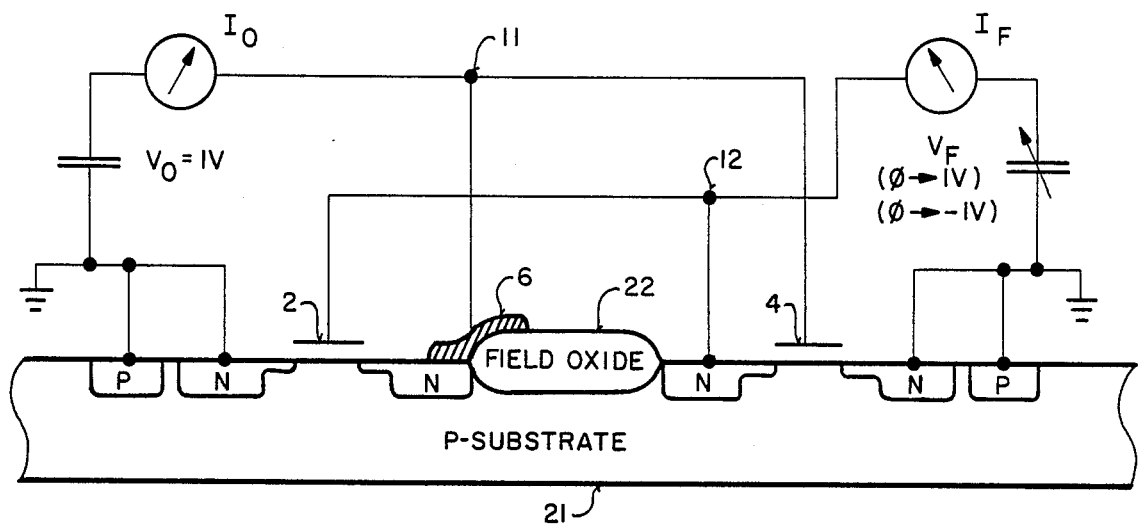
FIG_4A  EQUIVALENT CIRCUIT WITH BIAS CONDITIONS
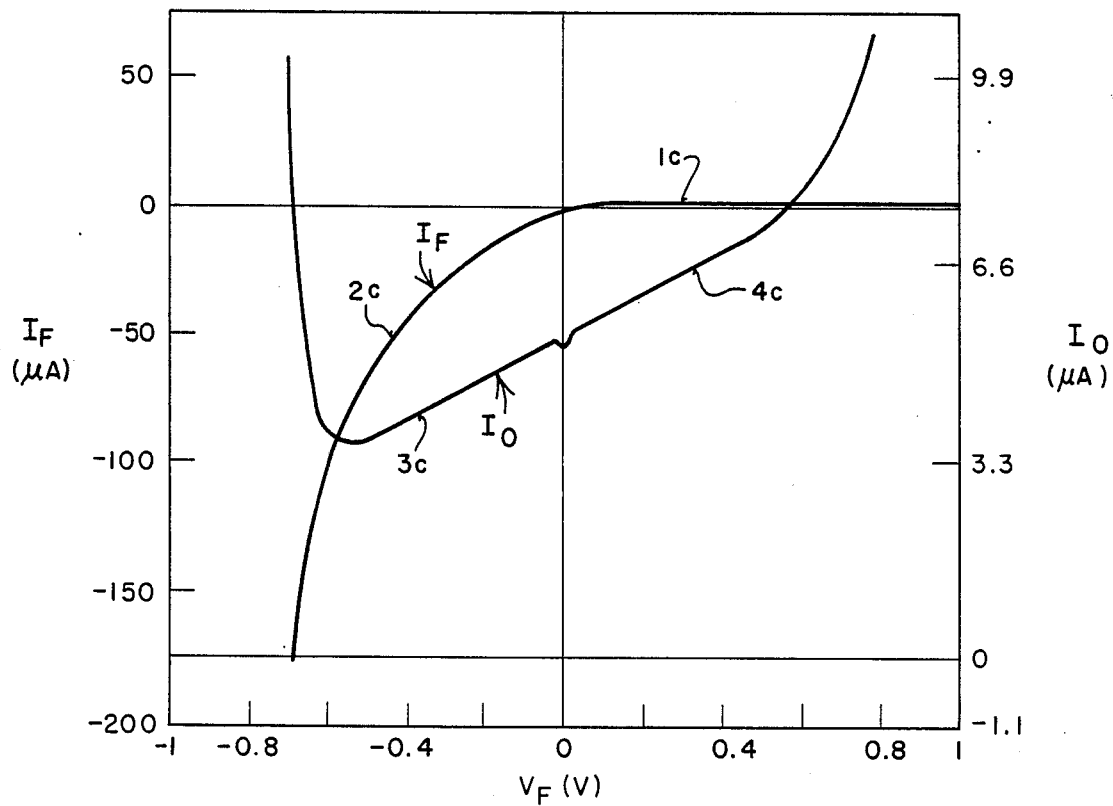
FIG_4B  ELECTRICAL SIGNATURE WITH $V_F$ AT NODE B(12) FOR FAILED CELL

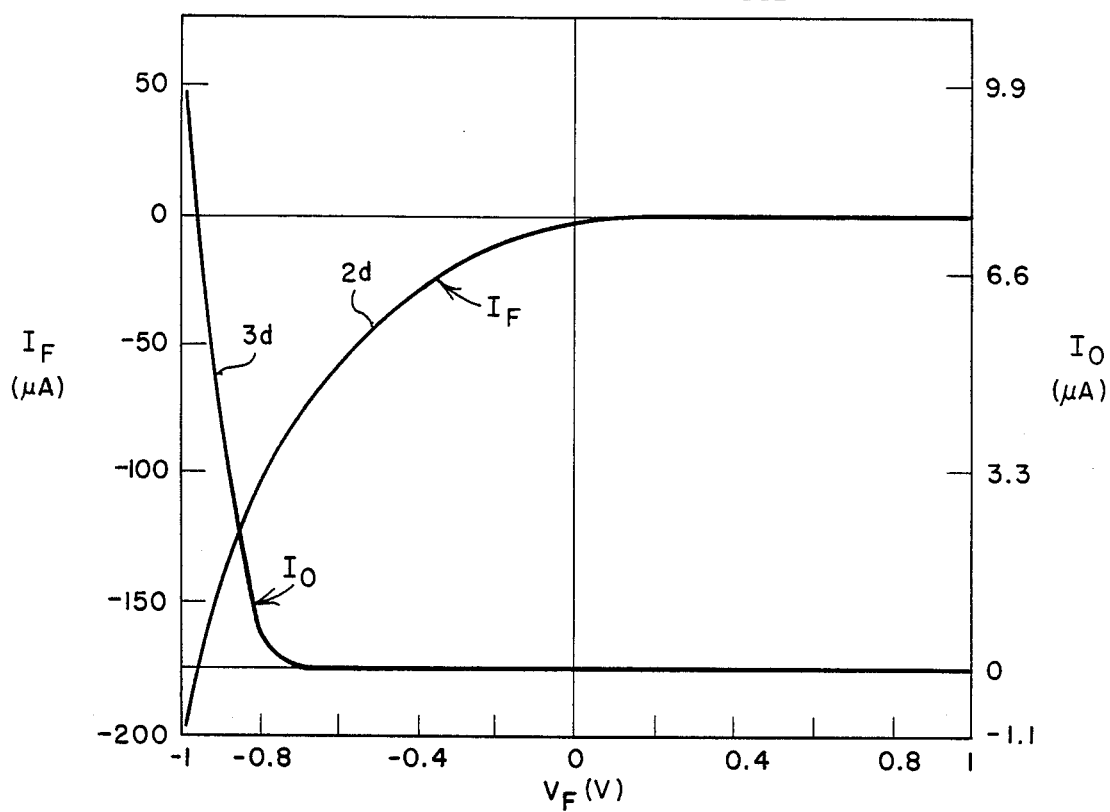
FIG_5 ELECTRICAL SIGNATURES WITH SOURCE/SUBSTRATE FLOAT FOR A GOOD CELL
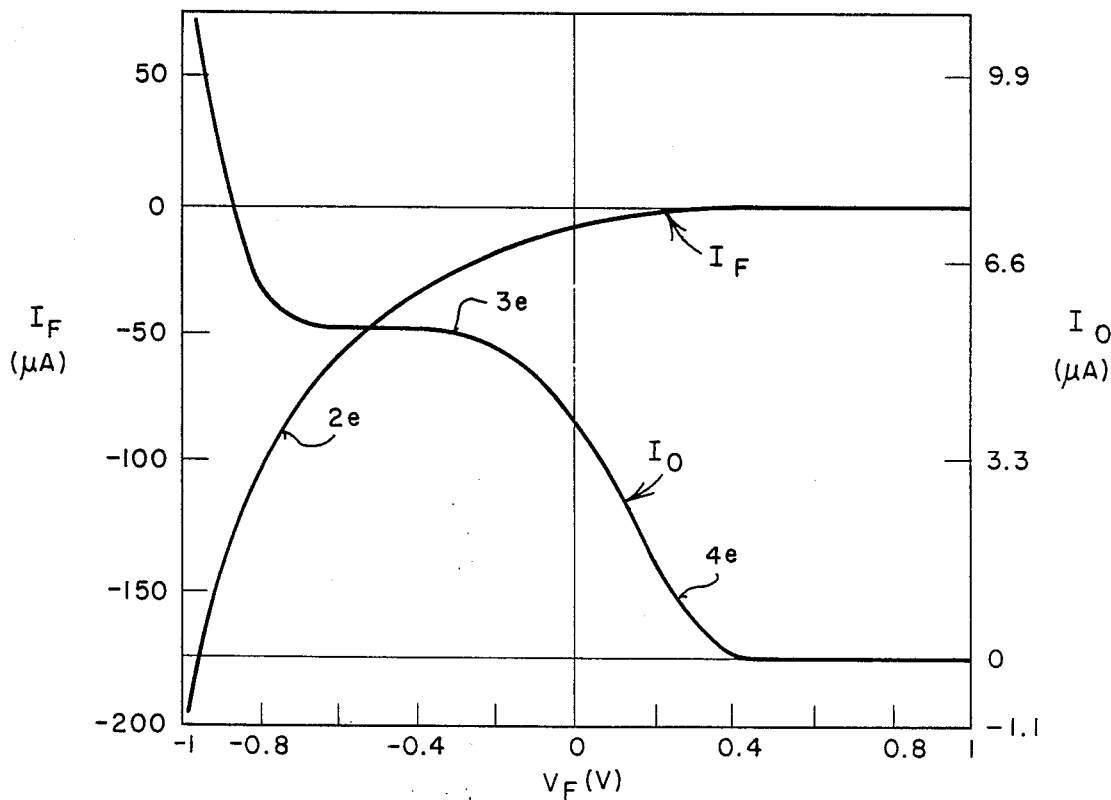
FIG_7 ELECTRICAL SIGNATURES WITH SOURCE/SUBSTRATE FLOAT FOR A FAILED CELL

FIG_6A
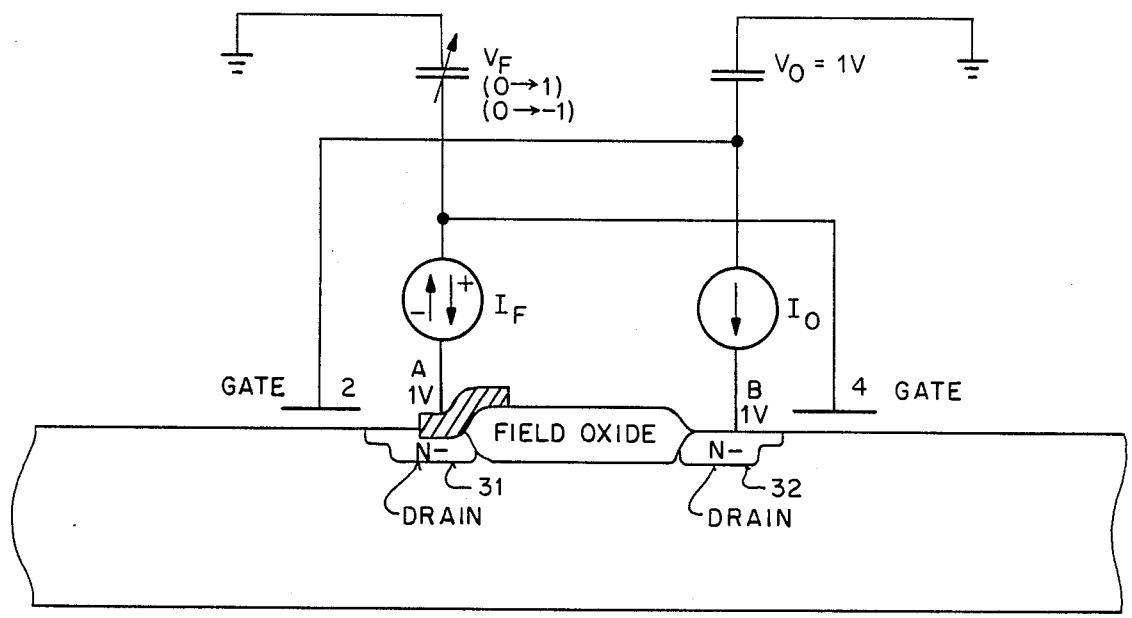
FIG_6B
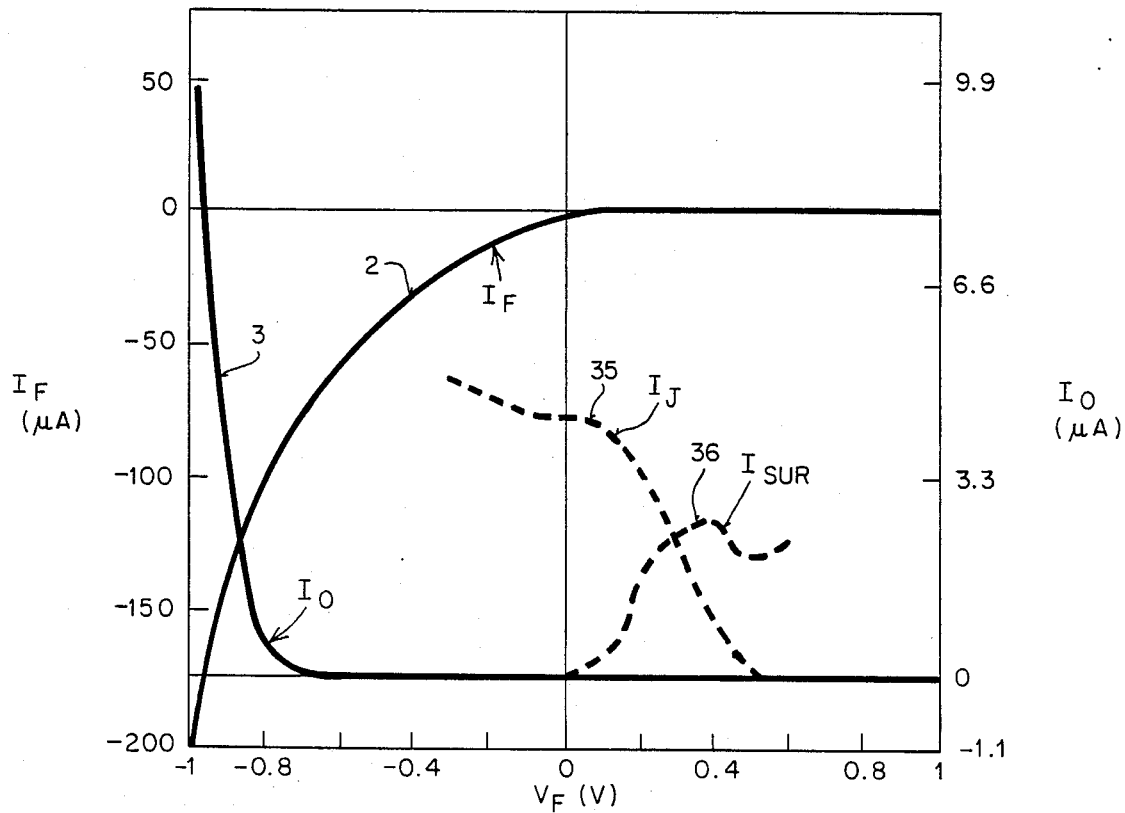

SIGNATURE ANALYSIS TECHNIQUE FOR DEFECT CHARACTERIZATION OF CMOS STATIC RAM CELL FAILURES

BACKGROUND OF THE PRESENT INVENTION

1. Field of the invention.

The invention relates to the field of error testing semiconductor memories and logic circuits. More specifically, to the field of testing any cross coupled latches such as static RAM memories and inverters in periphery circuits.

2. Prior Art.

Error testing of semiconductor memories to determine the exact failed cell is well known in the art. For example, a conventional method such as a logic analyzer can be used to generate a map of failed cells. Based on the cell map, failure analysis tools such as liquid crystal analysis or an emission microscope are used to locate the faulty cell and give additional information as to the cause of failure. For example, a liquid crystal analysis could reveal a leaky hot spot on n-channel or p-channel transistors or an emission microscope could reveal oxide leakage.

Electrical signature analysis methods have been developed in which voltages are applied to failed cells to measure the transistor parameters in order to determine the cause of the failure. Furthermore, the technique is capable of identifying the source of the transistor failure by distinguishing various transistor leakage currents. However, there has always been the problem that previous signature analysis techniques could not test the individual transistor parameters without physical isolation. Physical isolation consists of cutting the lines connecting the transistor to the rest of the IC, thus destroying its utility. So it was impossible to use previous signature analysis techniques on integrated circuits without destroying their utility.

With CMOS static RAM technology, the individual transistors are densely packed, so physical separation is nearly impossible on such high-density chips without damage. Other techniques can be used to find some causes of transistor failure, but none are as thorough or reliable as the present invention. For example, liquid crystal techniques can find leaky transistors but it can not establish the exact location or parameters to determine exactly where the leakage occurs. Laser or photoresist isolation methods can measure parameters but they have proved to be time consuming and difficult, and these techniques can damage the device so that the results are often inconclusive.

Measuring individual transistor parameters is crucial to device design and process testing. Current methods for doing so are unreliable, difficult, and usually destroy the device tested. Also, because of the etch rate of a plasma etcher being different for high and low circuit density regions, a technique for measuring individual transistor parameters in different circuit density areas would provide valuable information for process control and design verification. Until now, there was no such measurement technique available.

SUMMARY OF THE PRESENT INVENTION

A method of detecting individual faulty transistors in a CMOS static RAM memory without physical isolation to discover the cause of transistor failure is described. The process includes isolating the failed CMOS static RAM cell which has two access transistors, two n-channel transistors and two p-channel transistors. A pair of either the n-channel or p-channel transistors are electronically isolated for testing. Then a microprobe is used at two different metal nodes so that voltages can be run in both a fixed and a variable bias resulting in a graph of current flow through the circuit as the voltage varies. Then, using electrical signature analysis techniques, the results of the testing are compared to normal measurements to determine the specific cause of the transistor failure.

The failed cell is located by using any one or combination of conventional methods. The two access transistors are allowed to float, and the four transistors in the isolated circuit can be analyzed. To test the n-channel transistors a voltage of 1 V is applied to the p-channel transistors on Vcc, to test the p-channel transistors a voltage of $-1$ V is applied to the n-channel transistors on Vss. This effectively eliminates the p-channel or n-channel transistors from the circuit. By this electrical biasing scheme the pairs of transistors can be tested alone. The bias voltage is not limited to 1 V or $-1$ V. Any appropriate voltage can be used as long as the bias scheme is followed.

A voltage source is then applied by two microprobes to the active transistors. One microprobe has a constant voltage of 1 V, the other has a positive or negative bias voltage that varies from 0 V to an appropriate value. The amount of current is then measured as a function of the varying voltage.

The results of the tests are compared to the results of identical tests on perfectly functioning circuits. By using an electrical signature analysis technique the results of the two tests are compared and conclusions as to the actual parameters are made. By this method the mechanism of transistor failure can be determined. Furthermore, individual parameters such as subthreshold leakage current, threshold voltage, transconductance, drain junction leakage, surface states induced leakage, gate leakage, and drain current can be readily measured.

BRIEF DESCRIPTION OF THE DRAWINGS

FIG. 1 is a schematic diagram of a typical CMOS static RAM cell having an additional feature of a buried contact.

FIG. 2 shows the graphic plot of the microprobe's current versus the microprobe's voltage in a typical CMOS static RAM of FIG. 1.

FIG. 3a shows a cross sectional view of an equivalent circuit of FIG. 1 when Vcc=1 V, voltage is varied at node A, and voltage is fixed at node B.

FIG. 3b shows the graphic plot of the microprobe's current versus the microprobe voltage in the failed cell with the bias conditions of FIG. 3a.

FIG. 4a shows a cross sectional view of an equivalent circuit of FIG. 1 when Vcc×1 V, voltage is fixed at node A, and voltage is varied at node B.

FIG. 4b shows the graphic plot of the microprobe's current versus the microprobe's voltage varies in the failed cell with the bias conditions of FIG. 4a.

FIG. 5 shows the graphic plot of circuit current versus voltage floats on Vss in a typical CMOS static RAM.

FIG. 6a shows a cross sectional view of an equivalent circuit of the ungated field oxide transistor.

FIG. 6b shows the graphic plot of the microprobe's current versus the varying voltage with the bias conditions of FIG. 6a.

FIG. 7 shows the graphic plot of circuit current versus voltage with $V_{ss}$ float in the failed cell.

DETAILED DESCRIPTION OF THE INVENTION

A new method of electrical signature analysis is described. In the following description, specific examples of circuit failures are used to provide an illustration of the present invention. However, it will be understood by those skilled in the art that numerous variations in form and detail may be within the teachings or present disclosure. The present invention may be practiced to deal with many types of transistor failure. Accordingly, it is to be understood that the terminology used is for the purpose of description rather than limitation.

Referring first to FIG. 1, a typical CMOS static RAM cell is shown as described in U.S. Pat. No. 4,613,886. The cell is comprised of two n-channel transistors 2 and 4 and two p-channel transistors 1 and 3 in an isolated section 20, connected on each side with n-channel access transistors 16 and 17. Transistors 1 and 2 are coupled in series between Vcc and Vss, transistors 3 and 4 are coupled in series between Vcc and Vss and form a second leg parallel to the first leg formed by transistors 1 and 2. The gate and one terminal of transistor 17 is coupled to node A (reference number 11), which is the junction of transistors 1 and 2. The other terminal of transistor 17 is coupled to a first test terminal. The gates of transistors 1 and 2 are coupled to node B (reference number 12), which is at the junctions of transistor 3 and 4. One terminal of transistor 16 is coupled to node B while the gate and the other terminal of transistor 16 are coupled to a second test terminal. However, the isolated section 20 is the only area that is dealt with because the two access transistors can be allowed to float. In some circuits this may not be the case, and in those an external clock signal can be used to disable the two access transistors 16 and 17.

At this point either p-channel transistors 1 and 3 or n-channel transistors 2 and 4 can be turned off and thus eliminated from the test circuit. This is done by applying an appropriate voltage to the appropriate Vcc 9 or Vss 8 pin in conjunction with the bias conditions of the fixed and ramping voltages described below. In the example, either one volt on Vcc to turn off the p-channel transistors 1 and 3, or $-1$ V on Vss to turn off the n-channel transistors 2 and 4.

In this example, p-channel transistors 1 and 3 have been turned off by applying 1 V to Vcc 9 and therefore the testing circuit or equivalent circuit becomes that which is shown in FIGS. 3a or 4a. Microprobes are used to apply a ramped forcing voltage, or $V_F$, and a fixed voltage, $V_o$, to the isolated circuit. Current is measured both at the ramped forcing voltage microprobes $I_F$, and at the fixed voltage microprobe, $I_o$. The n-channel transistors 2 and 4 can be tested by running a microprobe to node A and applying a positive biased variable voltage (0 volt to 1 V). The same process is then done by varying the voltage on node B and holding node A fixed in a similar manner as before, forming the equivalent circuit as shown in FIG. 4a. The results of this are graphed as voltage ($V_f$) versus response currents $I_f$ and $I_O$ as in FIG. 2 (good cell) or FIGS. 3a and 4b (failed cells). By comparing results of the current as applied on the failed circuit, as in FIGS. 3b and 4b, to the typical graph, as in FIG. 2, the source of error can be identified. To achieve the desired results only the positive bias voltage need be applied, but the use of the negative bias voltage is useful as a way of checking a certain failure mechanism.

An equivalent technique can be applied to the p-channel transistors 1 and 3 by applying $-1$ volts on Vss 8 thus turning off n-channel transistors 2 and 4 and running similar voltages on nodes A or B to produce graphs for those transistors.

Equipment such as microprobes and variable power supplies are well known in the art. The range of voltages for use in testing varies according to the amount of leakage and the type of failures. In this particular example the range described was adequate to fully analyze the device failure as given above.

The junction leakage current can be separated from the transistor channel leakage by simply floating Vss 8. The Vss line is common ground to both source and substrate and the electrical signatures with the Vss float can be obtained such as FIG. 5 (good cell) and FIG. 7 (failed cell). By using the source substrate float, junction current leakage can be separated from transistor channel leakage, and surface leakage.

Referring to FIG. 5 where current is measured as $V_{ss}$ floats neither the transistor drain current can flow nor can the transistor turn on as curves 1a and 4a in FIG. 2 show. Here curve 1a represents transistor 2's saturation current and curve 4a represents transistor 4's threshold voltage. As a result, transistors 2 and 4 do not function as transistors, rather, as an ungated field oxide transistor with the gates of transistors 2 and 4 acting as field plates for the ungated field oxide transistor. This is shown in FIG. 6a.

Referring to FIG. 6a the transistor 4 drain junction 32 is reversed bias to a fixed 1 V while the transistor 2 drain junction 31 varies from 0 to 1 V as indicated by VF. The transistor 4 drain junction 32 is always reversed bias with respect to the transistor 2 drain junction 31. For example, when $V_F$ equals 0 V the transistor 4 drain junction 32 becomes 1 V reversed bias with respect to the transistor 2 drain junction 31 which is 0 V in this case. If the junction leakage is dominant then a drain junction leakage will flow even when $V_F$ equals 0 V. As $V_F$ increases from 0 to 1 V the transistor 4 drain junction leakage will decrease since the transistor 4 junction voltage with respect to the transistor 2 junction voltage decreases. This is shown by curve 35 $I_J$ in FIG. 6b.

However, the transistor 4 junction leakage may be due to the transistor 4 surface leakage. The transistor 4 junction is at 1 V reversed bias as described above while the transistor 4 gate voltage varies from 0 V to 1 V. This is the same as a gated diode current when the transistor 4 gate is at 0 V or $V_F$ equals 0 V the surface accumulates and no surface leakage occurs. As the transistor 4 gate voltage or $V_F$ increases from 0 V to 1 V the surface becomes depleted and the surface leakage current increases accordingly since the surface leakage occurs only when the surface becomes depleted as the transistor gate voltage increases above 0.8 V the surface becomes inverted and the surface leakage decreases. This is shown by Curve 36 $I_{SUR}$ in FIG. 6b. Thus, the junction leakage $I_J$ starting high where $V_F$ equals 0 V decreases as $V_F$ increases from 0 V to 1 V while the surface leakage $I_{SUR}$ increases with $V_F$.

If channel leakage predominates then no transistor current will appear with $V_F$ from 0 V to 1 V with the $V_{ss}$ float. While if surface or junction leakage predominates then a large leakage indicated by $I_J$ or $I_{SUR}$ will still remain with the $V_{ss\ float\ as\ seen\ in\ FIG.\ 6}b$ (failed circuit).

Electrical signature analysis techniques are used to compare electrical signatures for n-channel transistors 2 and 4 as shown in FIG. 3b with typical signatures for the same conditions in a good cell, as shown in FIG. 2. Had liquid crystal analysis been used to locate the defective cell the liquid crystal analysis would have revealed that one of the n-channel transistors was defective. However, liquid crystal analysis cannot determine the exact in the n-channel transistor, such as junction, channel, or gate. Furthermore, the current invention can compare different parameters to determine the exact transistor and cause of the failure. As $V_F$ is raised from 0 V to 1 V, the gate voltage of transistor 4 increases accordingly. Thereby, its threshold voltage, looks normal when compared to FIG. 2.

Referring to transistor 2 which is on, with a voltage from 0 V, to 1 V on its drain, its drain current characteristic is obtained as indicated by curve 1b of FIG. 3b, which is significantly higher with no saturation compared to a good unit in FIG. 2. This result signifies that the drain current of transistor 2 is abnormal. In FIG. 3a, curves 2b and 3b look normal as compared to FIG. 2. Curves 2b and 3b were obtained by applying a voltage of 0 V to $-1$ V the transistor 2 drain and the transistor 4 gate. Based on this result, transistor 4 is perfectly normal while transistor 2 is not normal. Its drain leakage current is very high although at this point the origin of the leakage current is unknown.

The next step is interchanging the microprobes so that $V_F$ is applied to node B forming the equivalent circuit in FIG. 4a which results in FIG. 4b. This is the same as the lower half of the isolated circuit 20 in FIG. 1, with Vcc 9 at 1 V, $V_F$ being applied by a microprobe at node B, and $V_o$ being applied by a microprobe at node A. Transistor 4 is on and the drain of transistor 2 is at 1 V. As $V_F$ is increased from 0 to 1 V the transistor 2 gate and the transistor 4 drain voltages increase accordingly. The threshold voltage of transistor 2 indicated by curve 4c shows an excessively high leakage. The drain current of transistor 4 is indicated by curve 1c of FIG. 4b. For the negative bias region, a voltage of 0 to $-1$ V is applied to the gate of transistor 2 and to the drain of transistor 4. Curve 3c shows a large leakage. The curve 3c leakage current is contributed by transistor 2 current which is leaky and the collector current of the parasitic bipolar transistor. The current decreases with $V_F$, which is due to the decrease in the transistor 2 current as the gate voltage approaches from 0 to $-1$ V. Curve 2c of FIG. 4b is normal.

The abnormally high leakage current indicated by curves 3c and 4c of FIG. 4b and curve 1b in FIG. 3b clearly shows that transistor 2 is defective. Transistor 4, on the other hand, has shown normal characteristics as indicated by curves 1c and 2c of FIG. 4b and curves 2b, 3b and 4b of FIG. 3b. This is conclusive evidence that transistor 4 is normal. The origin of the leakage current in transistor 2 will be determined by separating the transistor channel leakage from the junction leakage current and then from the surface leakage. This is accomplished with a Vss float technique as mentioned above.

Using the Vss float technique an equivalent circuit similar to that shown in FIG. 4a, except for the substrate connection, is created and the resulting current is shown on FIG. 7. If the transistor leakage was predominantly due to the channel leakage such as subthreshold, punchthrough and drain field induced impact ionization, the leakage current would disappear with Vss float. In this instance, no transistor current would appear at all. However, FIG. 7 shows that the leakage still remains. This suggests that the leakage current is not due to the channel leakage, and therefore, it must derive from the drain junction of transistor 2 or from the surface leakage associated with transistor 4. The shape of the leakage current indicated by curves 3e and 4e can be explained by referring to the equivalent circuit in which $V_F$ is applied to node B. The shape of curve 4e in FIG. 7 is similar to curve $I_J$ in FIG. 6b. Even with $V_F$ equal to 0 V, a large leakage current around 4 microamperes occurs. The leakage current behavior as $V_F$ varies is explained above. It is not a surface leakage from transistor 2 since the surface leakage should increase as $V_F$ varies from 0 to 1 V. Therefore, the leakage current is from the reverse biased transistor 2 drain junction, since when transistor 4 drain junction is at 0 V the reverse biased voltage of the transistor 2 drain junction is 1 V. Since 1 V is shared by both junctions, the actual voltage drop across the transistor 2 drain junction is approximately 0.45 V, and the rest or approximately 0.55 V is dropped across the forward biased transistor 4 drain junction. As $V_F$ is increased from 0 V to 1 V the leakage current indicated by curve 4e decreases with $V_F$ because the voltage drop in the transistor 2 drain junction decreases with $V_F$, and becomes 0 V with $V_F$ equal to around 0.45 V. Beyond the 0.45 V there is no leakage current since the transistor 4 drain junction becomes reverse biased instead and transistor 4 is normal. This validates that the leakage current originates from the reverse biased transistor 2 drain junction.

Although the analysis can be terminated at this point, it is continued to determine the current represented by curve 3e of FIG. 7. As $V_F$ is applied negatively from 0 V to $-1$ V to the transistor 2 drain junction, the transistor 2 drain junction leakage current rapidly increases due to the increase in reverse biased voltage across the transistor 2 drain junction This controls until the parasitic bipolar transistor current takes over as indicated by a sharp increase in the current The increase in the leakage current with the reverse bias voltages shows the fact that the leakage results from the transistor 2 drain junction.

Thus, an electrical signature failure analysis method for static CMOS memory cells has been described which provides for the individual identification of the transistor and its failure mechanism in the failed cell. A method is described by which to obtain the parameters from that failed transistor where the measured transistor parameters include threshold voltage, transconductance, subthreshold leakage, gate leakage, drain current, junction and surface leakages. Furthermore, the technique is capable of identifying the source of the transistor failure by distinguishing various transistor leakage currents, which is accomplished by employing a unique bias voltage scheme to electrically isolate the transistor in the failed cell and varying the gate voltage on the gated diode structures. Using the new analysis technique, extended life test failures of a CMOS microprocessor chip containing static RAM memory cells are successfully analyzed and several failure mechanisms are identified. The technique is extremely simple, reliable and can be used in AC and DC modes. The technique can be used to test any cross coupled latch circuitry such as static RAMs and inverters.

I claim:

1. A method of determining a cause of a failure in a Complementary Metal-Oxide-Semiconductor (CMOS) Static Random Access Memory (SRAM) device comprised of a plurality of memory cells, each memory cell having a first pair of CMOS transistors comprise of a first n-channel transistor and a first p-channel transistor coupled in series between a supply voltage ($V_{cc}$), and a return voltage ($V_{SS}$), a second pair of CMOS transistors comprise of a second n-channel transistor and a second p-channel transistor coupled in series between the $V_{cc}$ and $V_{SS}$, such that a first node is formed at a junction of said first n-channel transistor and said first channel p-channel transistor, and said second node is formed at a junction of a second n-channel transistor and said second p-channel transistor, wherein gates of said first pair of CMOS transistors are coupled to said second nodes, and wherein gates of said second pair of CMOS transistors are coupled to said first node, comprising the steps of:

(a) isolating a defective memory cell within said memory;
(b) making non-conductive said pair of p-channel transistors by applying a predetermined positive voltage on said p-channel transistors;
(c) applying a first variable voltage on said first node while holding a first fixed voltage on said second node, wherein said first variable voltage varies between 0 V and a first predetermined positive voltage level;
(d) measuring current at said two nodes as said first variable voltage is varied;
(e) applying a second variable voltage on said second node while holding a second fixed voltage on said first node, wherein said second variable voltage varies between 0 V and a second predetermined positive voltage level;
(f) measuring current at said two nodes as said second variable voltage is varied;
(g) comparing results of voltage versus current for each of said n-channel transistors to known results of properly functioning n-channel transistors of an operative memory cell to determine of said failure is caused by one of said n-channel transistors.

2. The method described in claim 1 wherein step (c) further includes the step of:

applying said first variable voltage on said first node n-channel transistors in a negative bias direction from 0 V to a predetermined voltage while holding said first fixed voltage on said second node, wherein said first variable voltage varies between 0 V and a first predetermined negative voltage level and,
wherein step (e) further includes the step of:
applying said second variable voltage on said second node while holding said second fixed voltage on said first node, wherein said second variable voltage varies between 0 V and a second predetermined negative voltage level.

3. The method described in claim 1 further including the step of using said measuring steps to determine sub-threshold leakage current, threshold voltage, transconductance, drain junction leakage, surface states induced leakage, gate leakage and drain current of a failed transistor.

4. The method described in claim 1 wherein said first and second variable voltages used range from approximately 0 V to 1 V in a positive direction and approximately 0 V to −1 V in a negative direction.

5. A method of determining a cause of a failure in a Complementary Metal-Oxide-Semiconductor (CMOS) Static Random Access Memory (SRAM) device comprised of a plurality of memory cells, each memory cell having a first pair of CMOS transistors comprise of a first n-channel transistor and a first p-channel transistor coupled in series between a supply voltage ($V_{cc}$), and a return voltage ($V_{ss}$), a second pair of CMOS transistors comprise of a second n-channel transistor and a second p-channel transistor coupled in series between the $V_{cc}$ and $V_{ss}$ such that a first node is formed at a junction of said first n-channel transistor and said first p-channel transistor, and said second node is formed at a junction of a second n-channel transistor and said p-channel transistor, wherein gates of said first pair of CMOS transistors are coupled to said second nodes, and wherein gates of said second pair of CMOS transistors are coupled to said first node, comprising the steps of:

(a) isolating a defective memory cell within said memory;
(b) making non-conductive said pair of n-channel transistors by applying a predetermined negative voltage on said n-channel transistors;
(c) applying a first variable voltage on said first node while holding a first fixed voltage on said second node, wherein said first variable voltage varies between 0 V and a first predetermined negative voltage level;
(d) measuring current at said two nodes as said first variable voltage is varied;
(e) applying a second variable voltage on said second node while holding a second fixed voltage on said first node, wherein said second variable voltage varies between 0 V and a second predetermined negative voltage level;
(f) measuring current at said two nodes as said second variable voltage is varied;
(g) comparing results of voltage versus current for each of said p-channel transistors to known results of properly functioning p-channel transistors of an operative memory cell to determine if said failure is caused by one of said p-channel transistors.

6. The method described in claim 5, wherein (c) further the step (c) further includes the step of:

applying said first variable voltage on said first node while holding said first fixed voltage on said second node, wherein said first variable voltage is varied between 0 V and a first predetermined positive voltage level; and
wherein step (e) further includes the step of:
applying said second variable voltage on said second node while holding said second fixed voltage on said first node, wherein said second variable voltage varies between 0 V and a second predetermined positive voltage level.

7. The method described in claim 5 further including the step of using said measuring steps to determine sub-threshold leakage current, threshold voltage, transconductance, drain junction leakage, surface states induced leakage, gate leakage and drain current of a failed transistor.

8. The method described in claim 5, wherein said first and second variable voltages used range from approximately 0 V to 1 V in a positive direction and approximately 0 V to −1 V in a negative direction.

9. A method of determining a cause of a failure in a CMOS Static Random Access Memory (SRAM) comprised of a plurality of memory cells, each memory cell having a first transistor and a second transistor coupled in series between a power source terminal and a return terminal where said first transistor is a p-channel transistor and said second transistor is a n-channel transistor, a third transistor and a fourth transistor coupled in series between said power source terminal and said return terminal where said third transistor is a p-channel transistor and said fourth transistor is a n-channel transistor, a fifth transistor having a first terminal coupled to a junction of said first transistor and said second transistor and to gates of said third transistor and said fourth transistor, a sixth transistor having a first terminal coupled to junctions of said third transistor and said fourth transistor and to gates of said first transistor and said second transistor, said method comprising the steps of:

(a) isolating a defective memory cell within said memory by causing second terminals of said fifth transistor and said sixth transistor to float;

(b) making non-conductive said first transistor and said third transistor by applying a positive voltage of approximately 1 V on said power source terminal;

(c) applying a first variable voltage to said first terminal of said fifth transistor in a positive direction from approximately 0 V to 1 V while holding a first fixed voltage at approximately 1 V on said first terminal of said sixth transistor;

(d) measuring current at said first terminal of said fifth transistor;

(e) applying a second variable voltage to said first terminal of said sixth transistor in a positive direction from approximately 0 V to 1 V while holding a second fixed voltage at approximately 1 V on said first terminal of said fifth transistor;

(f) measuring current provided to said first terminal of said sixth transistor;

(g) comparing results of voltage versus current for each of said second and fourth transistors to known results of properly functioning transistors of an operative memory device to determine if said failure is caused by one of said second and fourth transistors.

10. The method described in claim 9 further including the steps of:

applying said first variable voltage on said first terminal of said fifth transistor in a negative direction from approximately 0 V to 1 V while holding said first fixed voltage at approximately 1 V on said first terminal of said sixth transistor;

applying said second variable voltage on said first terminal of said sixth transistor in a negative direction from approximately 0 V to −1 V while holding said second fixed voltage at approximately 1 V on said first terminal of said fifth transistor.

11. The method described in claim 9 further including the step of using said measuring steps to determine subthreshold leakage current, threshold voltage, transconductance, drain junction leakage, surface states induced leakage, gate leakage and drain current of a failed transistor.

12. A method of determining a cause of a failure in a CMOS Static Random Access Memory (SRAM) comprised of a plurality of memory cells; each memory cell having a first transistor and a second transistor coupled in a series between a power source terminal and a return terminal where said first transistor is a p-channel transistor and said second transistor is a n-channel transistor, a third transistor and a fourth transistor coupled in a series between said power source terminal and said return terminal where said third transistor is a p-channel transistor and said fourth transistor is a n-channel transistor, a fifth transistor having a first terminal coupled to junctions of said first transistor and said second transistor and to gates of said third transistor and said fourth transistor, a sixth transistor having a first terminal coupled to junctions of said third transistor and said fourth transistor and to gates of said first transistor and said second transistor; said method of comprising the steps of:

(a) isolating a defective memory cell within said memory by causing second terminals of said fifth transistor and said sixth transistor to float;

(b) making non-conductive said second transistor and said fourth transistor by applying a negative voltage of approximately −1 V on said return terminal;

(c) applying a first variable voltage to said first terminal of said fifth transistor in a negative direction from approximately 0 V to 1 V while holding a first fixed voltage at approximately 1 V on said first terminal of said sixth transistor;

(d) measuring current provided to said first terminal of said fifth transistor;

(e) applying a second variable voltage to said first terminal of said sixth transistor in a negative direction from approximately 0 V to −1 V while holding a second fixed voltage at approximately −1 V on said first terminal of said fifth transistor;

(f) measuring current provided to said first terminal of said sixth transistor;

(g) comparing results of voltage versus current for each of said first and third transistors to known results of properly functioning transistors of an operative memory device to determine if said failure is caused by one of said first and third transistors.

13. The method described in claim 12 further including the steps of:

applying said first variable voltage on said first terminal of said fifth transistor in a positive direction from approximately 0 V to −1 V while holding said first fixed voltage at approximately 1 V on said first terminal of said sixth transistor;

applying said second variable voltage on said first terminal of said sixth transistor in a positive direction from approximately 0 V to 1 V while holding voltage at approximately −1 V on said first terminal of said fifth transistor.

14. The method described in claim 12 further including the step of using said measuring steps to determine subthreshold leakage current, threshold voltage, transconductance, drain junction leakage, surface states induced leakage, gate leakage and drain current of a failed transistor.

* * * * *

UNITED STATES PATENT AND TRADEMARK OFFICE
CERTIFICATE OF CORRECTION

PATENT NO. : 4,835,458

DATED : 5/30/89

INVENTOR(S) : Kim

It is certified that error in the above-identified patent and that said Letters Patent is hereby corrected as shown below:

col. 05, line 23     delete "3a"     insert --3b--

Signed and Sealed this

Twelfth Day of February, 1991

Attest:

HARRY F. MANBECK, JR.

Attesting Officer     Commissioner of Patents and Trademarks